US012542253B2

(12) United States Patent
Cook et al.

(10) Patent No.: US 12,542,253 B2
(45) Date of Patent: Feb. 3, 2026

(54) CHARGED PARTICLE OPTICS, CHARGED PARTICLE BEAM APPARATUS, AND METHOD FOR SCANNING A CHARGED PARTICLE BEAM

(71) Applicant: ICT Integrated Circuit Testing Gesellschaft für Halbleiterprüftechnik mbH, Heimstetten (DE)

(72) Inventors: Benjamin Cook, Putzbrunn (DE); Pieter Kruit, Delft (NL)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 390 days.

(21) Appl. No.: 18/115,688

(22) Filed: Feb. 28, 2023

(65) Prior Publication Data

US 2024/0290571 A1 Aug. 29, 2024

(51) Int. Cl.
*H01J 37/28* (2006.01)
*H01J 37/145* (2006.01)
(Continued)

(52) U.S. Cl.
CPC ........ *H01J 37/1474* (2013.01); *H01J 37/145* (2013.01); *H01J 37/20* (2013.01);
(Continued)

(58) Field of Classification Search
CPC ........ H01J 37/28; H01J 37/20; H01J 37/1474; H01J 37/1472; H01J 37/145; H01J 37/12;
(Continued)

(56) References Cited

U.S. PATENT DOCUMENTS 4,827,127 A * 5/1989 Todokoro .............. H01J 37/268 250/398
5,500,528 A * 3/1996 Matsui .................. H01J 37/244 250/397
(Continued)

FOREIGN PATENT DOCUMENTS

CN 115428116 A 12/2022
JP 2018-82120 A 5/2018
(Continued)

OTHER PUBLICATIONS

Search Report for Taiwan Patent Application No. 113105755, mailed May 21, 2025, 2 pages.

*Primary Examiner* — Wyatt A Stoffa
(74) *Attorney, Agent, or Firm* — Kilpatrick Townsend & Stockton LLP

(57) ABSTRACT

A charged particle optics for a charged particle beam apparatus having a charged particle beam and a beam propagation direction of the charged particle beam apparatus is described. The charged particle optics includes a focusing lens. The focusing lens includes a first electrode with a first aperture; a second electrode with a second aperture, the second electrode being mechanically movable at least in a first direction perpendicular to the beam propagation direction; and an actuator coupled to the second electrode to move the second electrode in at least the first direction for displacement of the second aperture with respect to the first aperture. The charged particle optics further includes a deflection system positioned upstream of the second electrode to deflect the charged particle beam, based on the displacement, to guide the charged particle beam through the second aperture.

19 Claims, 4 Drawing Sheets

(51) Int. Cl.
*H01J 37/147* (2006.01)
*H01J 37/20* (2006.01)

(52) U.S. Cl.
CPC ....... *H01J 37/28* (2013.01); *H01J 2237/0475* (2013.01); *H01J 2237/1501* (2013.01); *H01J 2237/151* (2013.01); *H01J 2237/152* (2013.01); *H01J 2237/2803* (2013.01)

(58) Field of Classification Search
CPC ......... H01J 2237/024; H01J 2237/0475; H01J 2237/04926; H01J 2237/1501; H01J 2237/151; H01J 2237/152; H01J 2237/2803; H01J 2237/0245
See application file for complete search history.

(56) References Cited

U.S. PATENT DOCUMENTS

| | | | | |
|---|---|---|---|---|
| 5,917,186 | A * | 6/1999 | Fujii | H01J 37/1471 850/43 |
| 6,495,841 | B1 * | 12/2002 | Ando | B82Y 40/00 250/492.23 |
| 7,326,927 | B2 * | 2/2008 | Frosien | H01J 37/28 250/311 |
| 8,035,082 | B2 * | 10/2011 | Yamazaki | G01N 23/2251 250/396 ML |
| 10,068,744 | B2 * | 9/2018 | Essers | H01J 37/222 |
| 10,134,558 | B2 * | 11/2018 | Sohda | H01J 37/145 |
| 10,340,117 | B2 * | 7/2019 | Matsubara | H01J 37/26 |
| 2003/0111619 | A1 * | 6/2003 | Ito | H01J 37/3174 250/492.23 |
| 2008/0230694 | A1 * | 9/2008 | Frosien | H01J 37/12 250/398 |
| 2009/0242792 | A1 * | 10/2009 | Hosoya | H01J 37/222 250/397 |
| 2012/0145899 | A1 * | 6/2012 | Matsumoto | H01J 37/18 250/310 |
| 2014/0361167 | A1 * | 12/2014 | Morishita | H01J 37/28 250/310 |
| 2016/0189916 | A1 | 6/2016 | Frosien et al. | |
| 2019/0318906 | A1 * | 10/2019 | Li | H01J 37/28 |
| 2020/0333271 | A1 * | 10/2020 | Hendrich | H01J 37/285 |
| 2024/0128043 | A1 * | 4/2024 | Van Soest | H01J 37/12 |

FOREIGN PATENT DOCUMENTS

| | | | |
|---|---|---|---|
| TW | 201833968 | A | 9/2018 |
| TW | 202117784 | A | 5/2021 |

* cited by examiner

CHARGED PARTICLE OPTICS, CHARGED PARTICLE BEAM APPARATUS, AND METHOD FOR SCANNING A CHARGED PARTICLE BEAM

TECHNICAL FIELD

Embodiments described herein relate to a charged particle optics for a charged particle beam apparatus, for example in an electron microscope, particularly in a scanning electron microscope (SEM). Embodiments further relate to a method for scanning a charged particle beam over a sample in a charged particle beam device. Specifically, embodiments relate to a charged particle optics for a charged particle beam apparatus, a charged particle beam apparatus and method of imaging a sample in a charged particle beam device.

BACKGROUND

Modern semiconductor technology has created a high demand for structuring and probing specimens in the nanometer or even in the sub-nanometer scale. Micrometer and nanometer-scale process control, inspection or structuring, is often done with charged particle beams, e.g. electron beams, which are generated, shaped, deflected and focused in charged particle beam apparatuses, such as electron microscopes or electron beam pattern generators. For inspection purposes, charged particle beams offer a superior spatial resolution compared to, e.g., photon beams.

Apparatuses using charged particle beams, such as scanning electron microscopes (SEM), have many functions in a plurality of industrial fields, including, but not limited to, inspection of electronic circuits, exposure systems for lithography, detecting systems, defect inspection tools, and testing systems for integrated circuits. In such particle beam systems, fine beam probes with a high current density can be used. For instance, in the case of an SEM, the primary electron beam generates signal particles like secondary electrons (SE) and/or backscattered electrons (BSE) that can be used to image and/or inspect a sample.

Reliably inspecting and/or imaging samples with a charged particle beam apparatus at a good resolution is, however, challenging. Further, particularly in the semiconductor industry, throughput, for example, for image generation is beneficially high. Further, low energy particle beams are beneficial for in-line inspection and/or imaging. The throughput influencing factors like the size of the field of view (FOV), particularly the FOV size being limited relative to the size of the wafer, and the collection efficiency of signal particles, and factors like the resolution and the beam energy on a specimen, for example, a wafer, can contradict each other for the beneficial design of an electro-optical component.

In light of the above, providing an improved charged particle optics for a charged particle beam apparatus, an improved charged particle beam apparatus, and an improved method of scanning a charged particle beam over a sample are beneficial.

SUMMARY

In light of the above, a charged particle optics for a charged particle beam apparatus, a charged particle beam apparatus, and a method of focusing the charged particle beam are provided according to the independent claims.

According to an embodiment, a charged particle optics for a charged particle beam apparatus having a charged particle beam and a beam propagation direction of the charged particle beam apparatus is provided. The charged particle optics includes a focusing lens. The focusing lens includes a first electrode with a first aperture; a second electrode with a second aperture, the second electrode being mechanically movable at least in a first direction perpendicular to the beam propagation direction; and an actuator coupled to the second electrode to move the second electrode in at least the first direction for displacement of the second aperture with respect to the first aperture. The charged particle optics further includes a deflection system positioned upstream of the second electrode to deflect the charged particle beam, based on the displacement, to guide the charged particle beam through the second aperture.

According to an embodiment, a charged particle beam apparatus is provided. The charged particle beam apparatus includes an emitter configured a emit a charged particle beam; a scan deflector to scan the charged particle beam within a field of view; and a charged particle optics according to any of the embodiments described herein, wherein the charged particle optics is configured to focus the charged particle beam and to deflect the charged particle beam within a field of movement.

According to an embodiments, a method for imaging a sample in a charged particle beam device having a charged particle optics with at least a first electrode with a first aperture and a second electrode with a second aperture is provided. The method includes (a) moving the second electrode with the second aperture at least in a first direction perpendicular to a beam propagation direction for displacement of the second aperture with respect to the first aperture; (b) guiding a charged particle beam through the first aperture of a first electrode; (c) deflecting the charged particle beam based on the displacement of the second aperture with respect to the first aperture; (d) guiding the charged particle beam through the second aperture onto the sample; (e) focusing the charged particle beam with a focusing lens including the first electrode and the second electrode; and (f) scanning the charged particle beam over the sample.

Further advantages, features, aspects and details that can be combined with embodiments described herein are evident from the dependent claims, the description and the drawings.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to one or more embodiments and are described in the following.

DETAILED DESCRIPTION

Figure 1A:
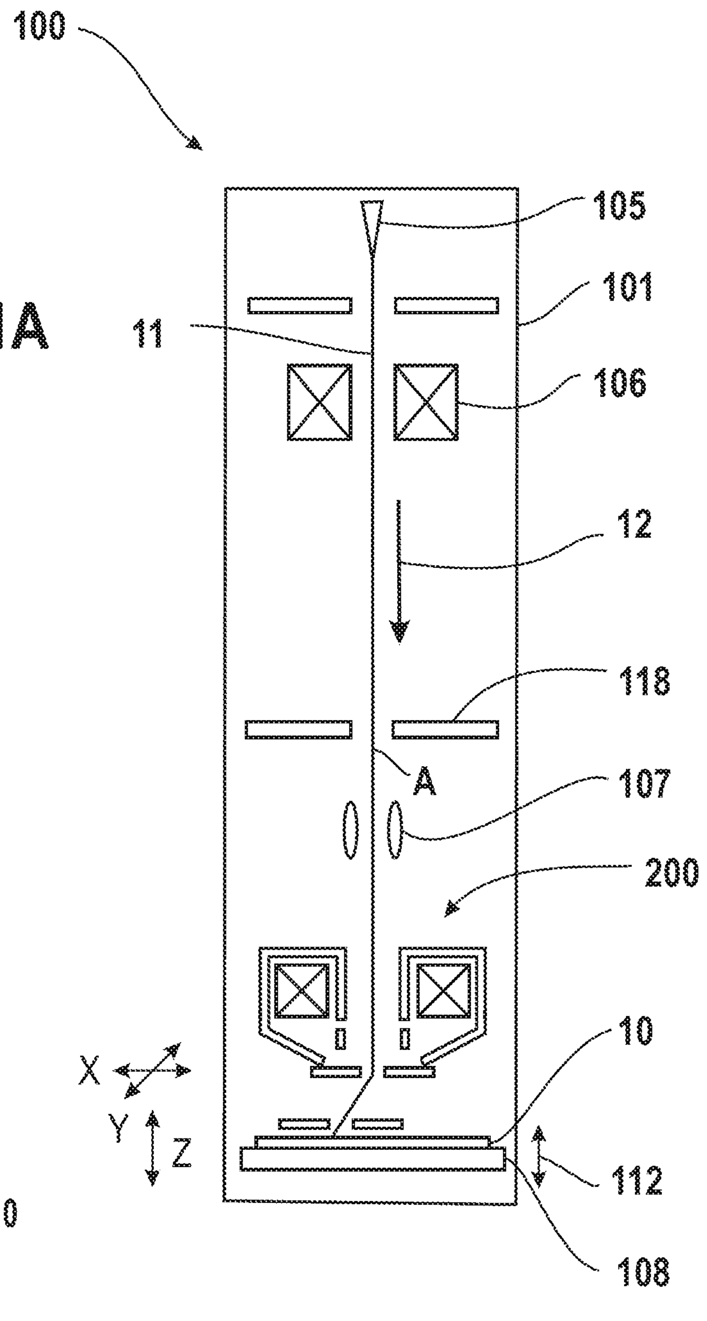
FIG. 1A shows a schematic view of a charged particle system according to embodiments described herein.

Reference will now be made in detail to the various embodiments, one or more examples of which are illustrated in the figures. Within the following description of the drawings, same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

According to an embodiment, a charged particle optics for a charged particle beam apparatus having a charged particle beam and a beam propagation direction of the charged particle beam apparatus is described. The charged particle optics includes a focusing lens having a first electrode with a first aperture; a second electrode with a second aperture, the second electrode being mechanically movable at least in a first direction perpendicular to the beam propagation direction; and an actuator coupled to the second electrode to move the second electrode in at least the first direction for displacement of the second aperture with respect to the first aperture. The charged particle optics further includes a deflection system positioned upstream of the second electrode to deflect the charged particle beam, based on the displacement, to guide the charged particle beam through the second aperture.

The second electrode can be very light, which results in the second electrode being easier to move than the substrate. Particularly, the second electrode can be moved faster than the substrate. By moving the second electrode to a new position where an image can be acquired the overhead time between images is reduced as compared to moving the sample, e.g. the substrate. Moving the charged particle beam correlated with moving the second electrode can increase the throughput of apparatuses using charged particle beams, such as scanning electron microscopes (SEM).

The charged particle beam can be deflected by the deflection system, based on the displacement of the second electrode, to guide the charged particle beam through the second aperture. Throughout this disclosure, based on the displacement of the second electrode, it is understood, unless otherwise indicated, that the charged particle beam is deflected in a way that the deflection of the charged particle beam results in a displacement of the charged particle beam, measured in the plane of the second electrode, equal to the displacement of the second electrode. The second electrode being mechanically movable at least in a first direction perpendicular to the beam propagation direction results in an increased main field of view as compared to a lens without a movable electrode. The main field of view is a combination of a field of movement of the second electrode and a field of view of a scanning system, i.e. a sub-field of view corresponding to scanning of the scanning deflector. Advantageously, the deflection system can deflect the charged particle beam based on the displacement, to guide the charged particle beam through the center of the second aperture. The first aperture and the second aperture can be at the position of the charged particle beam, even for a larger off-axis position as compared to a FOV without movement of the second electrode. By moving the second electrode to view the desired location on the wafer, e.g. the specified surface region, off-axis aberrations can be reduced. In some embodiments, which can be combined with other embodiments described herein, the displacement can be at least in the range of tens of microns, for example 20 μm or more. The displacement may be up to several millimeters, e.g. up to 10 mm. The displacement can be in the first direction and a second direction respectfully. Particularly, the second direction can be perpendicular to the beam propagation direction. The first direction and the second direction can form a plane, with the beam propagation direction being perpendicular to the plane.

FIG. 1A is a schematic view of a charged particle beam apparatus 100 for inspecting and/or imaging a sample 10 according to embodiments described herein. The charged particle beam apparatus 100 includes a charged particle source 105. The charged particle source can be configured to emit a charged particle beam 11. The charged particle beam may be an electron beam. The charged particle beam may propagate along an optical axis A.

Throughout this disclosure, the beam propagation direction 12 is understood, unless otherwise indicated, as the direction in which the charged particle beam travels from the charged particle source towards the charged particle optics. The charged particle beam can be deflected in the charged particle optics by the deflection system. After deflection of the charged particle beam by a deflection system, the charged particle beam can travel along a further direction. The direction of the charged particle beam after deflection by the deflection system is understood to be a deflected beam propagation direction. The beam propagation direction can be, for example, along the z-axis of the charged particle beam apparatus, as shown in FIG. 1A. The beam propagation direction can be perpendicular to an opening of the first aperture. The optical axis A is understood as the path on which the charged particle beam travels from the source to the charged particle optics or the path at which the charged particle beam enters the focusing lens, for example, a symmetry axis of the first electrode and/or a magnetic lens. The beam propagation direction can be parallel to and/or along the optical axis of the charged particle beam apparatus, particularly for a straight vision charged particle beam apparatus.

The charged particle beam apparatus 100 further includes a sample stage 108. The sample 10 can be placed on the sample stage 108. The charged particle beam apparatus 100 further includes a charged particle optics 200 for moving the charged particle beam over a sample and for focusing the charged particle beam according to embodiments described herein. The charged particle optics 200 includes a focusing lens and an actuator as described e.g. with respect to FIGS. 2A and 2B. The focusing lens may be an objective lens or a portion of an objective lens. The focusing lens can focus the charged particle beam 11 on the sample. The charged particle beam apparatus 100 further includes a charged particle detector 118, particularly an electron detector. The charged particle detector 118 can detect signal particles emitted from the sample 10. The charged particle detector 118 can detect signal electrons, for example, secondary electrons and/or backscattered electrons.

An image generation unit (not shown) may be provided. The image generation unit can be configured to generate one or more images of the sample 10. The image generation unit can generate the one or more images based on the signal received from the charged particle detector 118.

The sample stage 108 may be a movable stage. In particular, the sample stage 108 may be movable in the Z-direction, i.e., in the direction of the optical axis A, such that the distance between the focusing lens and the sample stage 108 can be varied (see arrow 112 in FIG. 1A). By moving the sample stage 108 in the Z-direction, the sample 10 can be moved to different "working distances". Further, the sample stage 108 may also be movable in a plane perpendicular to the optical axis A (also referred to herein as the X-Y-plane). By moving the sample stage 108 in the X-Y-plane, a specified surface region of the sample 10 can be moved into an area below the charged particle optics 200, such that the specified surface region can be imaged by focusing the charged particle beam 11 on the surface region of the sample.

The beam-optical components of the charged particle beam apparatus 100 can be placed in a vacuum chamber 101 that can be evacuated. A vacuum can be beneficial for propagation of the charged particle beam 11, for example, along the optical axis A from the charged particle source 105 toward the sample stage 108. The charged particle beam may hit the sample 10 under a sub-atmospheric pressure, e.g. a pressure below $10^{-3}$ mbar or a pressure below $10^{-5}$ mbar.

For example, the charged particle beam apparatus 100 may be an electron microscope, particularly a scanning electron microscope. A condenser lens system 106 may be arranged downstream of the charged particle source 105. The condenser lens system 106 can collimate the charged particle beam 11 propagating toward the charged particle optics 200.

One or more surface regions of the sample 10 can be inspected and/or imaged with the charged particle beam apparatus 100. The term "sample" as used herein may relate to a substrate, for example, with one or more layers or features formed thereon, a semiconductor wafer, a glass substrate, a flexible substrate, such as a web substrate, or another sample that is to be inspected. The sample can be inspected for one or more of (1) imaging a surface of the sample, (2) measuring dimensions of one or more features of the sample, e.g. in a lateral direction, i.e. in the X-Y-plane, (3) conducting critical dimension measurements and/or metrology, (4) detecting defects, and/or (5) investigating the quality of the sample.

For inspecting the sample 10 with the charged particle beam 11, the charged particle beam 11 can be focused on a sample surface with the focusing lens. Focusing of the focusing lens can be improved by correcting spherical aberration. Secondary electrons and/or backscattered electrons (referred to as "signal electrons") are emitted from the sample when the charged particle beam 11 impinges on the sample surface. The signal electrons provide information about spatial characteristics and dimensions of features of the sample. The signal electrons can be detected with the charged particle detector 118.

The scan deflector 107 can scan the charged particle beam 11 over the sample. The signal electrons can be detected as a function of time and, thus, the generation position of the signal electrons can be determined. The sample surface or a portion thereof can be imaged, e.g., with the image generation unit that may be configured to provide an image of the sample 10 based on the received signal electrons.

A scan deflector 107 may be provided for scanning the charged particle beam 11 over a surface of the sample 10 along a predetermined scanning pattern, for example, in the X-direction and/or in the Y-direction. The scan deflector 107 can scan the charged particle beam 11 over the sample. The scanning range of the scan deflector 107 can be limited in the X-direction and/or in the Y-direction, for example, by the tilt angle or the first aperture and/or the second aperture. The scan deflector 107 has a field of view (FOV) corresponding to the scanning range. The FOV is an area or a projected area on the sample surface, which can be scanned by the scan deflector. Particularly, the FOV is a projected area on the sample surface, which defines an area that can be scanned by the scan deflector for a set position of the second electrode and a set position of the sample.

The charged particle optics 200 can deflect or move the charged particle beam, for example, in the X-direction and/or the Y-direction. The deflection by the charged particle optics 200 can superposition the deflection by the scan deflector 107, such that the position of the FOV on the surface of the sample 10 can be changed. The deflection range of the charged particle optics 200 can be provided in the X-direction and/or the Y-direction, for example, by the deflection system and/or the displacement of the second electrode. The charged particle optics 200 has a field of movement (FOM) corresponding to the range of movement of the second electrode and/or the deflection range of the deflection system of the charged particle optics. The charged particle optics 200 can deflect the charged particle beam to a position within the FOM. Particularly, the charged particle optics 200 can deflect the FOV to a position within the FOM. Superposition of the FOV of the scan deflector 107 and the FOM of the charged particle optics 200 results in a main FOV of the charged particle beam apparatus. The FOV of the scan deflector can provide a sub-field of view within the main field of view. The main FOV is larger than the sub-field of view of the scan deflector.

The main FOV provides for faster imaging of a specified surface region to be imaged. Multiple surface regions (FOVs), which can be independent from each other, can be scanned for a set sample position, i.e. without moving the sample. Throughout this disclosure, unless otherwise indicated, two surface regions are independent from each other if the two surface regions have no overlap and/or the two surface regions cannot be scanned in a single FOV. For example, to image a specified surface region, the sample stage 108 can be moved to place the specified surface region within the main field of view of the charged particle optics 200. The charged particle optics 200 can move the FOV of the scanning deflector 107, such that a surface region to be scanned is located in the FOV. The FOM can be adjusted faster and more precisely than the sample stage 108, which allows for faster adjustment. After scanning the surface region, the charged particle optics 200 can move and/or deflect the FOV to a further surface region within the main field of view, such that the FOV at the further surface region is independent from the surface region, e.g. has no overlap with the FOV at the previous surface region.

Figure 1B:
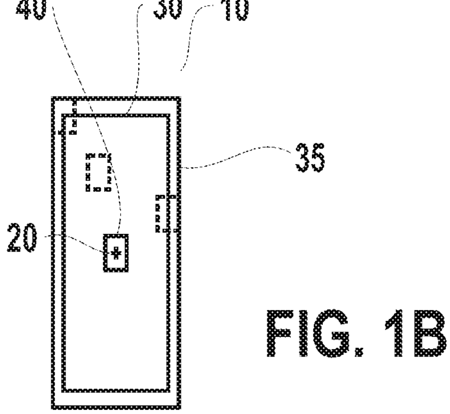
FIG. 1B shows a top view of the surface of the sample with the field of view (FOV) of the scanning deflector and the field of movement (FOM).

FIG. 1B shows a top view of the surface of the sample 10 with the FOV 40 of the scanning deflector 107 and the FOM 30 of the charged particle optics 200. Without deflection of the FOV 40 by the charged particle optics 200, the FOV is centered on a center 20 of the FOM. The charged particle optics 200 can move and/or deflect the FOV within the FOM, as depicted by the dotted FOVs. Particularly, the charged particle optics 200 can move and/or deflect the center of the FOV within the FOM. The FOM and the FOV result in a main field of view 35 as shown in FIG. 1B.

The first electrode and the second electrode can be configured such that a voltage can be applied to the first electrode and the second electrode. In some embodiments, which can be combined with other embodiments described herein, the charged particle optics can include a voltage supply assembly connected to the first electrode and the second electrode and configured to provide a voltage difference between the first electrode and the second electrode. For example, the voltage supply assembly can include a voltage supply connected to the first electrode and the second electrode. For example, the voltage supply assembly may include a first voltage supply connected to the first electrode and ground and a second voltage supply connected to the second electrode and ground, wherein the second voltage of the second voltage being independent from the first voltage. The first voltage supply and the second voltage supply can be configured to provide the first voltage to the first electrode and the second voltage to the second electrode to decelerate charged particles of the charged particle beam by the second electrode. particularly to provide a first voltage to the first electrode which is higher than a second voltage supplied to the second electrode for charged particles with negative charge, and to provide a first voltage to the first electrode which is lower than a second voltage supplied to the second electrode for charged particles with positive charge.

Figure 2A:
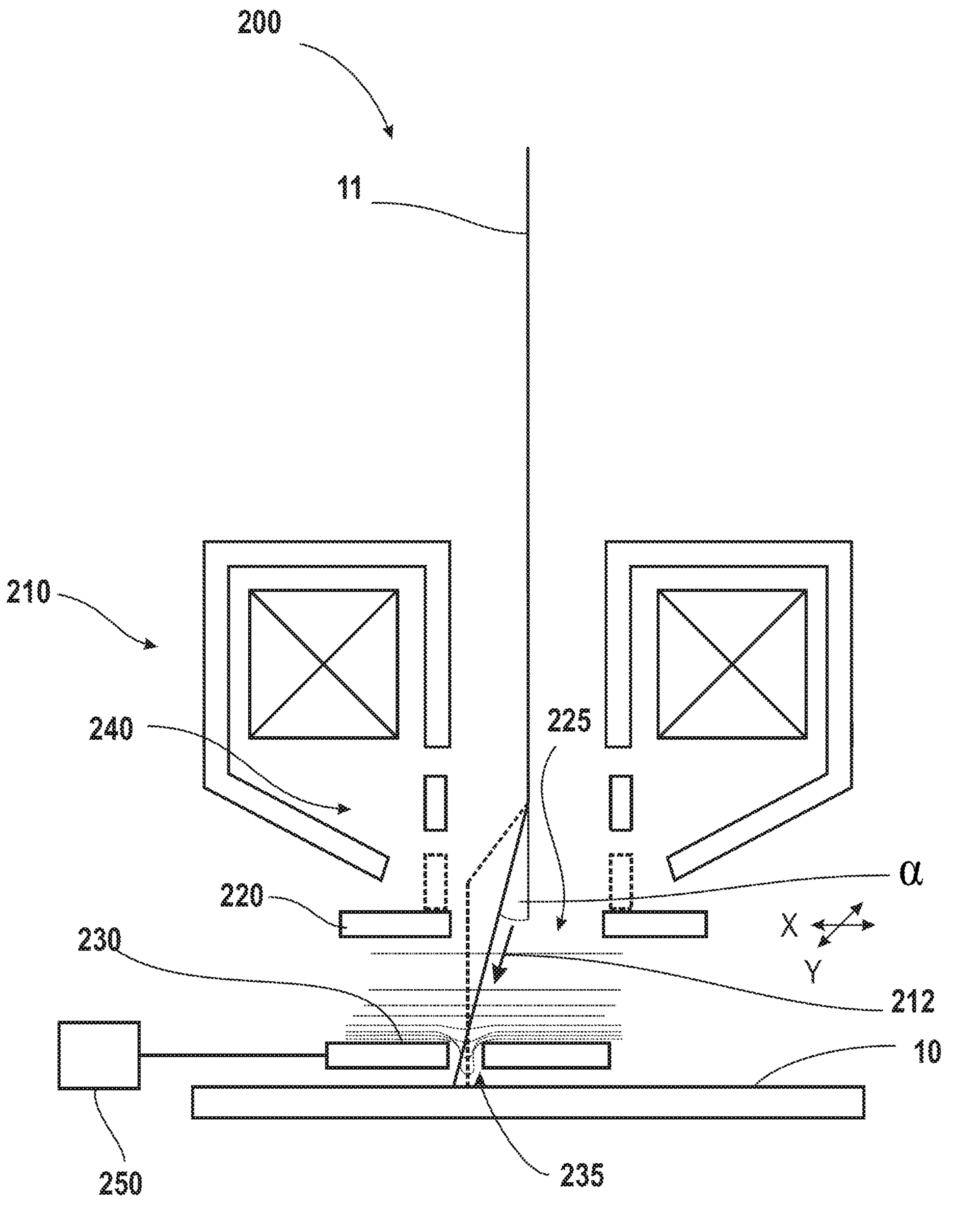
FIG. 2A shows a schematic view of a charged particle optics according to embodiments described herein.

FIG. 2A is a schematic view of a charged particle optics 200 according to embodiments described herein. The charged particle optics 200 comprises a focusing lens 210 having an electrostatic focusing lens and, optionally, a magnetic focusing lens for focusing the charged particle beam on the surface of the sample 10. The focusing lens can be an objective lens, particularly an electrostatic magnetic objective lens. In some embodiments, which can be combined with other embodiments described herein, the focusing lens includes a magnetic lens for focusing the charged particle beam.

The focusing lens 210, particularly the electrostatic lens of the focusing lens 210, comprises a first electrode 220 with a first aperture 225 and a second electrode 230 with a second aperture 235. The charged particle beam 11 can be guided through the first aperture 225 and through the second aperture. In some embodiments, which can be combined with other embodiments described herein, the first aperture and the second aperture are spaced apart at least 1 mm, and particularly up to 20 mm along the beam propagation direction.

The second electrode is mechanically movable at least in a first direction perpendicular to the beam propagation direction. An actuator 250 is coupled to the second electrode to move the second electrode in at least the first direction. The first direction is perpendicular to the beam propagation direction. The first direction can be, for example, along the x-direction shown in FIG. 2A. The second electrode can be mechanically movable in a second direction perpendicular to the beam direction. The second direction can be, for example, along the y-direction shown in FIG. 2A. A further actuator can be coupled to the second electrode to move the second electrode in the second direction. The first direction and the second direction can define a plane. The beam propagation direction can be perpendicular to the plane. A range of movement, i.e. a displacement of the second electrode, can be in the range of tens of microns, for example 20 μm or more. The range of movement may be up to several millimeters, e.g. up to 5 mm or 10 mm, for each direction (x-direction and y-direction).

According to some embodiments of the present disclosure, the actuator 250 can move the second electrode from a first position within the FOM to a second position within the FOM. Particularly, the second electrode can be moved after an image or sub-image of a FOV at the first position has been generated. After each generation of an image or sub-image of a FOV, the FOV can be moved to a new position within the FOM. As described above, by moving the second electrode to a new position where an image can be acquired the overhead time between images is reduced as compared to moving the sample. Accordingly, the actuator 250 and/or the second electrode can be configured to be moved within 1 second or less, particularly within 100 milliseconds or less, or even within 20 millisecond or less.

The charged particle optics includes a deflection system 240. The deflection system 240 is upstream of the second electrode 230. According to some embodiments of the present disclosure, the deflection system can in include one or more deflectors, particularly one or more deflectors for each of the x-direction and the y-direction. For example, a first deflector of the deflection system can be an alignment deflector to align the charged particle beam to the second electrode, i.e. to deflect the charged particle beam to the aperture of the second electrode, e.g. after movement of the second electrode. According to further implementations, the deflection system may include (for each direction) an alignment deflector and an inverse alignment deflector. As exemplarily shown in FIG. 2B, further deflectors can be provided.

The deflection system 240 or at least one deflector of the deflection system can be placed upstream of the first electrode. According to some embodiments, a magnetic deflector may also be placed between the first electrode and the second electrode. In some embodiments, which can be combined in other embodiments described herein, the deflection system includes a magnetic deflector. In alternative embodiments, the deflection system includes an electrostatic deflector, particularly an electrostatic deflector placed upstream of the first electrode. The deflection system 240 can deflect the charged particle beam by an angle α, such that the charged particle beam propagates along a deflected beam propagation direction 212 having an angle α to the beam propagation direction 12.

The deflected charged particle beam impacts the sample at a tilt angle measured to the surface normal. The tilt angle can be the angle α. By adjusting the position of the FOV of the scan deflector 107 within the FOM of the charged particle optics 200, the tilt angle α can be adjusted. According to some embodiments, which can be combined with other embodiments described herein, tilt angles of up to $\alpha_{max}$ 30°. For example, as exemplarily shown for a beam path depicted in FIG. 2B, a magnetic deflector, i.e. a tilt deflector, can be placed adjacent the second electrode, e.g. above the second electrode. The tilt deflector may introduce a beam tilt. The actuator can move the second electrode to adjust the position of the second electrode based upon the beam tilt. Accordingly, for embodiments including a beam tilt, the second electrode can be moved within the FOM such that the tilted beam passes through the second aperture at a predetermined position within the second aperture, e.g. the center of the aperture. Aberrations can be reduced by guiding a tilted beam through the center of the second aperture, e.g. by adjusting the position of the second aperture to the beam tilt.

The charged particle optics can include the deflection system having an alignment deflector and an inverse alignment deflector, as shown by the dotted line in FIG. 2A. The inverse alignment deflector can be upstream of the second electrode and the first electrode. The inverse alignment deflector can invert the deflection of the charged particle beam incurred by the alignment deflector. The inverse alignment deflector can deflect the deflected charged particle beam by an angle α', such that the charged particle beam propagates along a third beam propagation direction having an angle α' to the deflected beam propagation direction. Particularly, it can hold that a'=−α and the third beam propagation direction corresponds to the beam propagation direction. According to some embodiments, which can be combined with other embodiments described herein, the combination of the alignment deflector and the inverse alignment deflector can result in a beam landing angle without beam tilt, i.e. 0°. As shown in FIG. 2A by the dotted beam path, the charged particle beam can pass through the first aperture at an off-axis position with respect to the first aperture or an axis of the first aperture respectively, e.g. the center of the first aperture. Since the first electrode provides a weak focusing field, as can be seen by the equipotential lines, passing off-axis through the first aperture may introduce comparably small aberrations. The beam may pass through the second aperture on-axis, e.g. when the beam has a 0° tilt angle. Since the second electrode has a stronger focusing field as compared to the first electrode, passing through the center of the second aperture is beneficial.

In some embodiments, which can be combined with other embodiments described herein, the charged particle optics can include the deflection system having an inverse alignment deflector, configured to deflect the charged particle beam inverse to the deflection of the charged particle beam by the alignment deflector of the deflection system, resulting in a parallel displacement of the charged particle beam. Particularly, the second deflection can be based on the first deflection to create a z-displacement, resulting in parallel displacement of the charged particle beam. According to some embodiments, which can be combined with other embodiments described herein, the deflection system can include an alignment deflector and an inverse alignment deflector, wherein the alignment deflector and the inverse alignment deflector impose deflection angles in opposite directions.

Figure 2B:
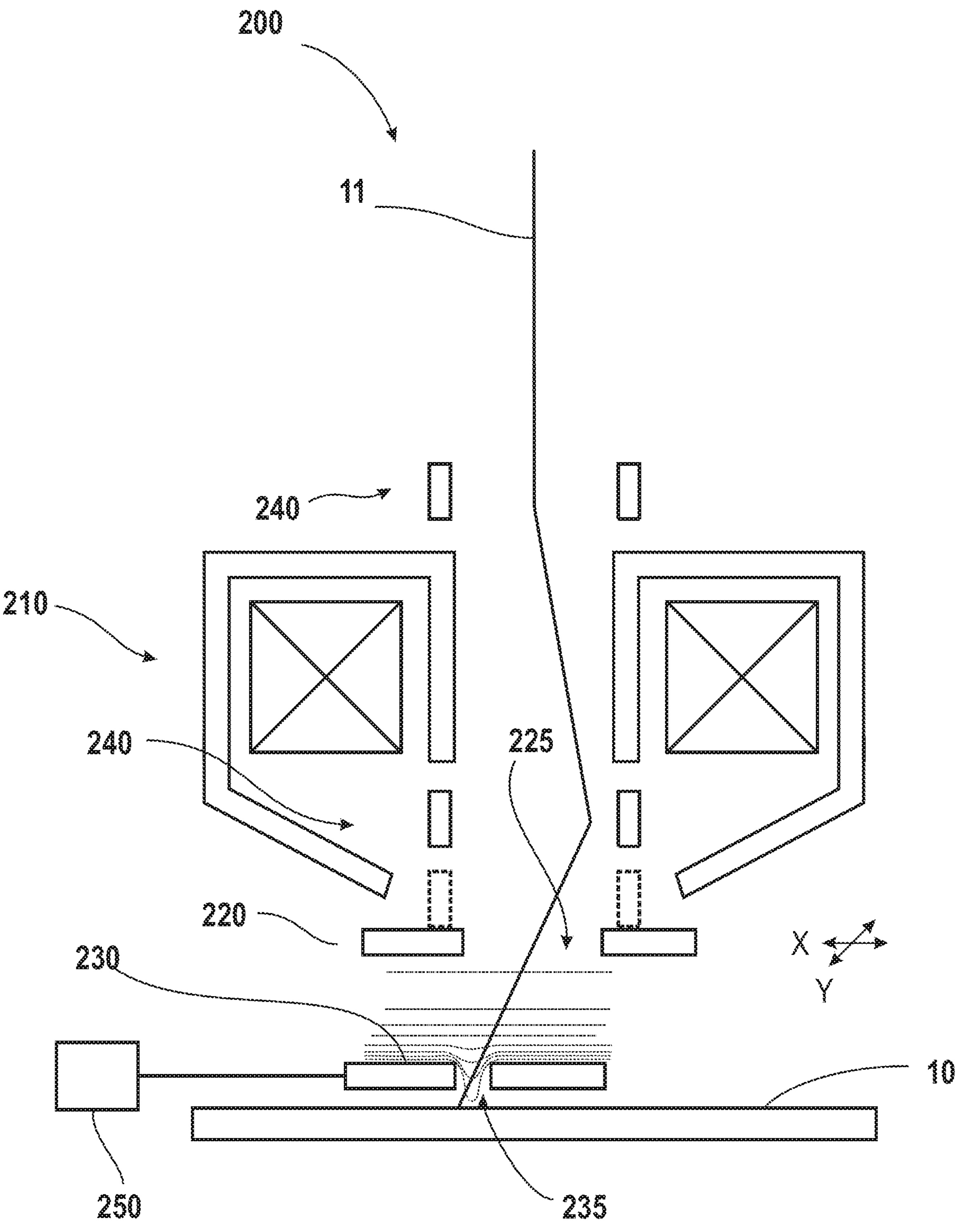
FIG. 2B shows a schematic view of a charged particle optics according to embodiments described herein.

As shown in FIG. 2B, the deflection system 240 may include further deflectors. For example, a deflector provided upstream of the focusing lens, particularly the magnetic lens, may deflect the charged particle beam away from the optical axis. A second deflector, for example, the alignment deflector may deflect the charged particle beam to pass through the first aperture and the second aperture on-axis, e.g. through the center of the first aperture and the center of the second aperture.

Figure 3:
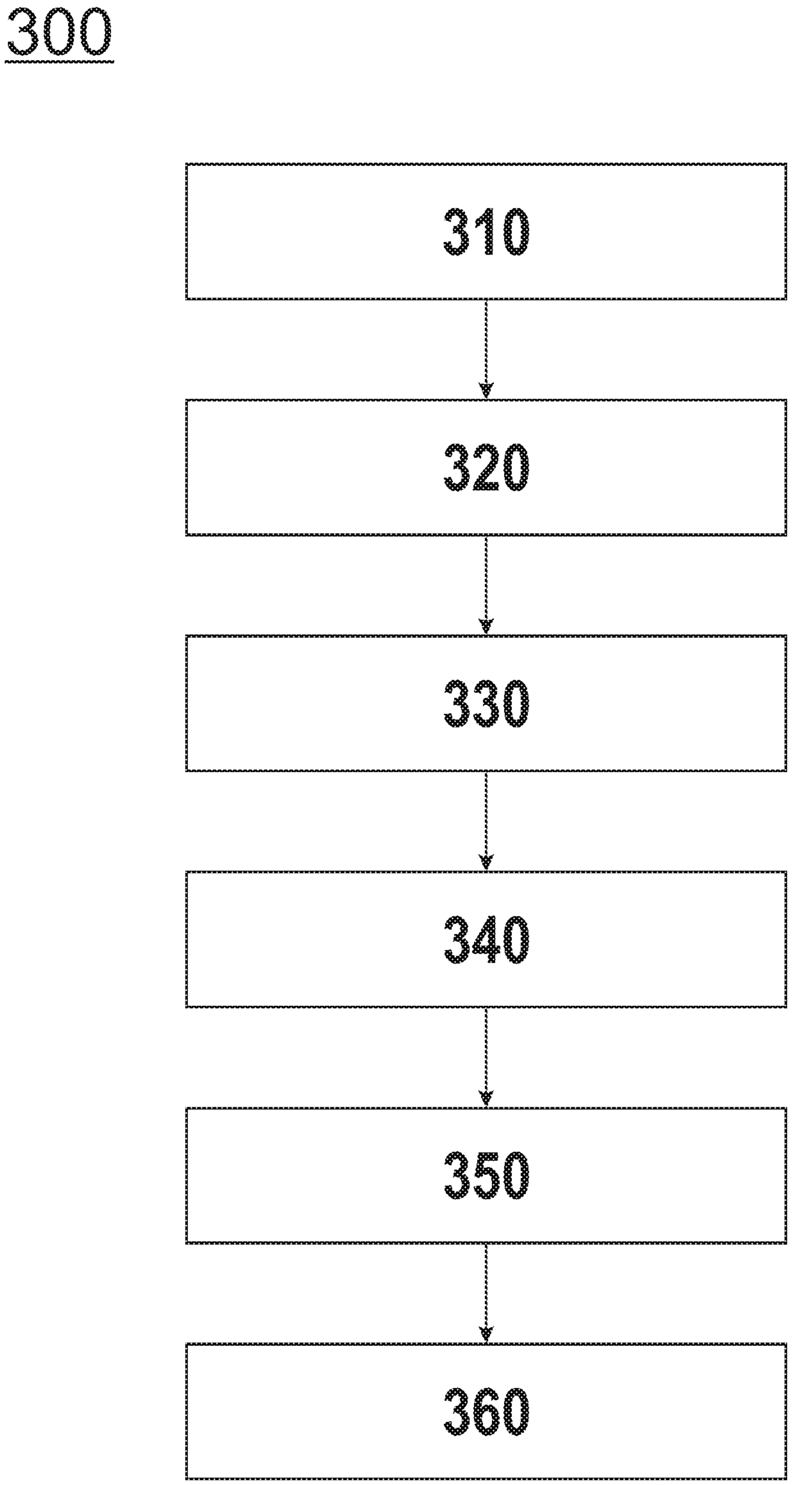
FIG. 3 shows a flow chart illustrating a method of scanning a charged particle beam over a substrate in a charged particle beam device according to embodiments described herein.

FIG. 3 shows a flow chart illustrating a method 300 of imaging a sample with a charged particle beam in a charged particle beam device according to embodiments described herein. At operation 310, the second electrode with the second aperture is moved at least in a first direction perpendicular to the beam propagation direction for displacement of the second aperture with respect to the first aperture. The charged particle beam propagates along the beam propagation direction from the source towards the first aperture. The beam propagation direction can be, for example, along the Z-axis, as shown in FIG. 1A. The second electrode can be moved, for example, along the X-direction and/or the Y-direction. The charged particle beam is guided through the first aperture of the first electrode at operation 320. Further, at operation 330 the charged particle beam is deflected based on the displacement of the second aperture with respect to the first aperture. The charged particle beam can be deflected by an angle $\alpha$, such that the charged particle beam propagates along a deflected beam propagation direction. The deflection angle $\alpha$ is such that the displacement of the charged particle beam in the plane of the second electrode corresponds to the displacement of the second electrode with respect to the first aperture. According to operation 340, the charged particle beam is guided through the second aperture onto the sample. Guiding the charged particle beam through the second electrode which has a displacement to the first electrode results in a displacement of the FOV of the scanning deflector. The FOV of the scanning deflector can be displaced to within the FOM. According to operation 350, the charged particle beam is focused with a focusing lens including the first electrode and the second electrode. At operation 360, the charged particle beam is scanned over the sample by the scanning deflector. The scan deflector scans the charged particle beam over the sample within the FOV.

According to an embodiment, a method 300 for imaging a sample in a charged particle beam device is described. The method includes the following operations: (a) moving the second electrode with the second aperture at least in a first direction perpendicular to a beam propagation direction for displacement of the second aperture with respect to the first aperture; (b) guiding the charged particle beam through a first aperture of a first electrode; (c) deflecting the charged particle beam based on the displacement of the second aperture with respect to the first aperture; (d) guiding the charged particle beam through the second aperture onto the sample; (e) focusing the charged particle beam with a focusing lens including the first electrode and the second electrode; and (f) scanning the charged particle beam over the sample.

According to some embodiments, which can be combined with other embodiments described herein, the charged particle beam can be guided through the first aperture off-axis with respect to a first axis of the first aperture and can be guided through the second aperture on-axis with respect to a second axis of the second aperture. For example, the charged particle beam can be guided through the first aperture off-axis and can be guided through the second aperture to be parallel to the beam propagation direction before entering the charged particle optics. The deflection system may deflect the charged particle beam by inversing the deflection of the charged particle beam to provide a parallel displacement of the charged particle beam.

According to some embodiments, which can be combined with other embodiments described herein, as exemplarily shown by the beam path in FIG. 2B the charged particle beam can be guided through the first aperture on-axis with respect to a first axis of the first aperture and can be guided through the second aperture on-axis with respect to a second axis of the second aperture.

Embodiments of the present disclosure allow to generate images at various FOVs without movement of the sample. Accordingly, the operations (a) moving the second electrode, (b) guiding the charged particle beam through a first aperture, (c) deflecting the charged particle beam, (d) guiding the charged particle beam through the second aperture, (e) focusing the charged particle beam, and (f) scanning the charged particle beam over the sample can be repeated one or more times. Particularly, between repeating the operations, the second electrode can be moved from a first position within a field of movement to a second position with the field of movement. Alternatively, the second electrode may be continuously moved and the beam is guided through the second aperture by continuously deflecting the charged particle beam in a manner corresponding to the continuous movement of the second electrode. For example, moving the second aperture can be a continuous movement and deflecting the charged particle beam can be a corresponding continuous deflection.

In some embodiments, which can be combined with other embodiments described herein, the focusing the charged particle beam can further include providing a voltage difference between the first electrode and a second voltage to the second electrode, particularly for decelerating the charged particle beam.

In some embodiments, which can be combined with other embodiments described herein, the method 300 further includes deflecting the charged particle beam inversing the deflection of the charged particle beam, to provide a parallel displacement of the charged particle beam. The charged particle beam is deflected by the inverse alignment deflector by an angle $\alpha'=-\alpha$, such that the charged particle beam propagates along the beam propagation direction. The charged particle beam has a parallel displacement with respect to the optical axis.

According to some embodiments, which can be combined with other embodiments described herein, the deflection of the charged particle beam through the first aperture and/or the second aperture can be adapted to optimize the spot size on the sample, and/or provide minimum chromatic aberrations and/or coma. In light of the stronger focusing field of the second electrode, particularly the deflection through the second aperture can be optimized as described above.

In some embodiments, which can be combined with other embodiments described herein, the method 300 further includes focusing the charged particle beam with a magnetic lens. The magnetic lens can focus the charged particle beam on the surface of the sample to reduce a spot size of the charged particle beam.

In light of the above, a plurality of embodiments are provided in the present disclosure, some of which are as follows:

Embodiment 1. A charged particle optics for a charged particle beam apparatus having a charged particle beam and a beam propagation direction of the charged particle beam apparatus, the charged particle optics comprising: a focusing lens, comprising: a first electrode with a first aperture; a second electrode with a second aperture, the second electrode being mechanically movable at least in a first direction perpendicular to the beam propagation direction; and an actuator coupled to the second electrode to move the second electrode in at least the first direction for displacement of the second aperture with respect to the first aperture; the charged particle optics further comprising: deflection system positioned upstream of the second electrode to deflect the charged particle beam, based on the displacement, to guide the charged particle beam through the second aperture.

Embodiment 2. The charged particle optics of embodiment 1, wherein the displacement can be at least 20 μm mm in the first direction and a second direction respectfully.

Embodiment 3. The charged particle optics of any one of embodiments 1 to 2, further comprising: a voltage supply assembly connected to the first electrode and the second electrode and configured to provide a voltage difference between the first electrode and the second electrode.

Embodiment 4. The charged particle optics of embodiment 3, wherein the voltage supply assembly comprises a first voltage supply and a second voltage supply, which are configured to provide a first voltage relative to ground to the first electrode and a second voltage relative to ground to the second electrode to decelerate charged particles of the charged particle beam by the second electrode.

Embodiment 5. The charged particle optics of any one of embodiments 1 to 4, wherein the first aperture and the second aperture are spaced apart at least 1 mm along the beam propagation direction.

Embodiment 6. The charged particle optics according to any one of embodiments 1 to 5, wherein the deflection system comprises an electrostatic deflector placed upstream of the second electrode.

Embodiment 7. The charged particle optics according to any one of embodiments 1 to 6, wherein the deflection system comprises a magnetic deflector placed upstream of the second electrode.

Embodiment 8. The charged particle optics according to any one of embodiments 1 to 7, wherein the focusing lens comprising a magnetic lens for focusing the charged particle beam, particularly wherein the magnetic lens is placed upstream from the second aperture.

Embodiment 9. The charged particle optics according to any one of embodiments 1 to 8, wherein the deflection system comprises: an alignment deflector; and an inverse alignment deflector, wherein the alignment deflector and the inverse alignment deflector imposing deflection angles in opposite directions.

Embodiment 10. A charged particle beam apparatus, comprising: an emitter configured a emit a charged particle beam; a scan deflector to scan the charged particle beam within a field of view; and a charged particle optics according to any of embodiments 1 to 9, wherein the charged particle optics is configured to focus the charged particle beam and to deflect the charged particle beam within a field of movement.

Embodiment 11. A method for imaging a sample in a charged particle beam device having a charged particle optics with at least a first electrode with a first aperture and a second electrode with a second aperture, the method comprising: (a) moving the second electrode with the second aperture at least in a first direction perpendicular to a beam propagation direction for displacement of the second aperture with respect to the first aperture; (b) guiding a charged particle beam through the first aperture of a first electrode; (c) deflecting the charged particle beam based on the displacement of the second aperture with respect to the first aperture; (d) guiding the charged particle beam through the second aperture onto the sample; (e) focusing the charged particle beam with a focusing lens including the first electrode and the second electrode; and (f) scanning the charged particle beam over the sample.

Embodiment 12. The method of embodiment 11, wherein the charged particle beam is guided through the first aperture off-axis with respect to a first axis of the first aperture and is guided through the second aperture on-axis with respect to a second axis of the second aperture.

Embodiment 13. The method of any of embodiments 11 to 12, wherein the charged particle beam is guided through the first aperture off-axis with respect to the first axis of the first aperture and is guided through the second aperture to be parallel to the beam propagation direction before entering the charged particle optics.

Embodiment 14. The method of any one of embodiments 11 to 13, further comprising: deflecting the charged particle beam by inversing the deflection of the charged particle beam to provide a parallel displacement of the charged particle beam.

Embodiment 15. The method of embodiment 11, wherein the charged particle beam is guided through the first aperture on-axis with respect to a first axis of the first aperture and is guided through the second aperture on-axis with respect to a second axis of the second aperture.

Embodiment 16. The method of any of embodiments 11 to 15, further comprising: decelerating the charged particle beam by the second electrode.

Embodiment 17. The method of any one of embodiments 11 to 16, further comprising: additionally focusing the charged particle beam with a magnetic lens.

Embodiment 18. The method of any of embodiments 11 to 17, further comprising: repeating operations (a) to (f), wherein the second electrode is during operation (a) moved from a first position within a field of movement to a second position with the field of movement.

Embodiment 19. The method of any of embodiments 11 to 17, wherein moving the second aperture is a continuous movement and deflecting the charged particle beam is a corresponding continuous deflection.

While the foregoing is directed to embodiments, other and further embodiments may be devised without departing from the basic scope, and the scope thereof is determined by the claims that follow.

What is claimed is:

1. A charged particle optics for a charged particle beam apparatus having a charged particle beam and a beam propagation direction of the charged particle beam apparatus, the charged particle optics comprising:

a focusing lens being an objective lens, comprising:

a first electrode with a first aperture;

a second electrode with a second aperture, the second electrode being mechanically movable at least in a first direction perpendicular to the beam propagation direction; and an actuator coupled to the second electrode to move the second electrode in at least the first direction for displacement of the second aperture with respect to the first aperture;

the charged particle optics further comprising:

one or more deflectors positioned upstream of the second electrode to deflect the charged particle beam, based on the displacement of the second aperture with respect to the first aperture, to guide the charged particle beam through the second aperture.

2. The charged particle optics of claim 1, wherein the displacement is at least 20 μm in the first direction and a second direction respectfully.

3. The charged particle optics of claim 1, further comprising:

a voltage supply assembly connected to the first electrode and the second electrode and configured to provide a voltage difference between the first electrode and the second electrode.

4. The charged particle optics of claim 3, wherein the voltage supply assembly comprises a first voltage supply and a second voltage supply, which are configured to provide a first voltage relative to ground to the first electrode and a second voltage relative to ground to the second electrode to decelerate charged particles of the charged particle beam by the second electrode.

5. The charged particle optics of claim 1, wherein the first aperture and the second aperture are spaced apart at least 1 mm along the beam propagation direction.

6. The charged particle optics of claim 1, wherein the one or more deflectors comprise an electrostatic deflector placed upstream of the second electrode.

7. The charged particle optics of claim 1, wherein the one or more deflectors comprise a magnetic deflector placed upstream of the second electrode.

8. The charged particle optics of claim 1, wherein the focusing lens comprising a magnetic lens for focusing the charged particle beam, and wherein the magnetic lens is placed upstream from the second aperture.

9. The charged particle optics of claim 1, wherein the one or more deflectors comprise:

an alignment deflector; and an inverse alignment deflector, wherein the alignment deflector and the inverse alignment deflector imposing deflection angles in opposite directions.

10. A charged particle beam apparatus, comprising:

an emitter configured a emit a charged particle beam;

a scan deflector to scan the charged particle beam within a field of view; and a charged particle optics of claim 1, wherein the charged particle optics is configured to focus the charged particle beam and to deflect the charged particle beam within a field of movement.

11. A method for imaging a sample in a charged particle beam device having a charged particle optics with at least a first electrode with a first aperture and a second electrode with a second aperture, the method comprising:

(a) moving the second electrode with the second aperture at least in a first direction perpendicular to a beam propagation direction for displacement of the second aperture with respect to the first aperture;

(b) guiding a charged particle beam through the first aperture of a first electrode;

(c) deflecting the charged particle beam based on the displacement of the second aperture with respect to the first aperture;

(d) guiding the charged particle beam through the second aperture onto the sample;

(e) focusing the charged particle beam with a focusing lens including the first electrode and the second electrode, the focusing lens being an objective lens; and (f) scanning the charged particle beam over the sample.

12. The method of claim 11, wherein the charged particle beam is guided through the first aperture off-axis with respect to a first axis of the first aperture and is guided through the second aperture on-axis with respect to a second axis of the second aperture.

13. The method of claim 11, wherein the charged particle beam is guided through the first aperture off-axis with respect to a first axis of the first aperture and is guided through the second aperture to be parallel to the beam propagation direction before entering the charged particle optics.

14. The method of claim 11, further comprising:

deflecting the charged particle beam by inversing the deflection of the charged particle beam to provide a parallel displacement of the charged particle beam.

15. The method of claim 11, wherein the charged particle beam is guided through the first aperture on-axis with respect to a first axis of the first aperture and is guided through the second aperture on-axis with respect to a second axis of the second aperture.

16. The method of claim 11, further comprising:

decelerating the charged particle beam by the second electrode.

17. The method of claim 11, further comprising:

additionally focusing the charged particle beam with a magnetic lens.

18. The method of claim 11, further comprising:

repeating operations (a) to (f), wherein the second electrode is during operation (a) moved from a first position within a field of movement to a second position with the field of movement.

19. The method of claim 11, wherein moving the second aperture is a continuous movement and deflecting the charged particle beam is a corresponding continuous deflection.

* * * * *